US011057554B2

United States Patent
Nakamura et al.

(10) Patent No.: US 11,057,554 B2
(45) Date of Patent: Jul. 6, 2021

(54) DISPLAY DEVICE WITH HOLLOWED PART IN BACKLIGHT

(71) Applicant: SHARP KABUSHIKI KAISHA, Sakai (JP)

(72) Inventors: Jin Nakamura, Sakai (JP); Nobuhisa Nakajima, Sakai (JP); Isao Takahashi, Sakai (JP); Hiroyuki Watatani, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 0 days.

(21) Appl. No.: 16/614,406

(22) PCT Filed: May 15, 2018

(86) PCT No.: PCT/JP2018/018675
§ 371 (c)(1),
(2) Date: Nov. 18, 2019

(87) PCT Pub. No.: WO2018/216545
PCT Pub. Date: Nov. 29, 2018

(65) Prior Publication Data
US 2020/0236259 A1 Jul. 23, 2020

(30) Foreign Application Priority Data
May 22, 2017 (JP) .............................. JP2017-100857

(51) Int. Cl.
*H04N 5/225* (2006.01)
*G02F 1/1333* (2006.01)
(Continued)

(52) U.S. Cl.
CPC ......... *H04N 5/2257* (2013.01); *G02F 1/1368* (2013.01); *G02F 1/133345* (2013.01);
(Continued)

(58) Field of Classification Search
CPC .................. H04N 5/2257; G02F 1/133345
See application file for complete search history.

(56) References Cited

U.S. PATENT DOCUMENTS

| 2008/0117497 A1 | 5/2008 | Shimodaira |
| 2008/0225216 A1 | 9/2008 | Shimodaira |

(Continued)

FOREIGN PATENT DOCUMENTS

| CN | 202394156 U | 8/2012 |
| JP | 2008-257191 A | 10/2008 |
| 2012/0105400 | A1 | 5/2012 Mathew et al. |
| 2013/0094126 Rappoport | A1 H01H/2013 | 361/679.01 |

(Continued)

*Primary Examiner* — Christopher K Peterson
(74) *Attorney, Agent, or Firm* — ScienBiziP, P.C.

(57) ABSTRACT

Disposing a functional device such as a camera on a display surface widens a frame. A display device (2) includes a display panel (DP) including a first substrate (5). The display panel has a transparent section (TS) from which display light does not go out and which has a partial region (5s) of the first substrate. In plan view, the transparent section which is larger than a pixel (PX) is disposed on an inner side of an edge of a display area (3) or is disposed to cut out the display area. The display panel has a back surface on which a functional device (FD) configured to perform at least one of light reception or light emission is disposed to overlap the transparent section.

23 Claims, 15 Drawing Sheets

(51) Int. Cl.
  *G02F 1/1335* (2006.01)
  *G02F 1/1362* (2006.01)
  *G02F 1/1368* (2006.01)
  *H01L 27/12* (2006.01)
  *H01L 27/32* (2006.01)
  *H01L 51/52* (2006.01)
  *G02F 1/133* (2006.01)
  *G02F 1/1343* (2006.01)
  *G09F 9/00* (2006.01)
  *G09F 9/30* (2006.01)

(52) U.S. Cl.
  CPC .. *G02F 1/133512* (2013.01); *G02F 1/133528* (2013.01); *G02F 1/136286* (2013.01); *H01L 27/124* (2013.01); *H01L 27/3234* (2013.01); *H01L 27/3276* (2013.01); *H01L 51/5253* (2013.01); *G02F 2201/121* (2013.01); *G02F 2201/123* (2013.01); *G02F 2201/50* (2013.01)

(56) References Cited

U.S. PATENT DOCUMENTS

| | | | |
|---|---|---|---|
| 2016/0155975 A1* | 6/2016 | Jin | H01L 51/447 257/40 |
| 2016/0202515 A1 | 7/2016 | Watanabe et al. | |
| 2016/0212311 A1 | 7/2016 | Mathew et al. | |
| 2017/0031202 A1* | 2/2017 | Lee | B32B 27/20 |
| 2017/0123454 A1 | 5/2017 | Evans et al. | |
| 2017/0168642 A1* | 6/2017 | Lee | G02F 1/134309 |
| 2017/0287992 A1* | 10/2017 | Kwak | G06F 3/041 |
| 2020/0186688 A1* | 6/2020 | Chen | G02F 1/133514 |
| 2020/0292882 A1* | 9/2020 | Nakamura | G02F 1/136286 |

FOREIGN PATENT DOCUMENTS

| | | |
|---|---|---|
| JP | 4886462 B2 | 2/2012 |
| JP | 2012-098726 A | 5/2012 |
| WO | 2015/029704 A1 | 3/2015 |

* cited by examiner

DISPLAY DEVICE WITH HOLLOWED PART IN BACKLIGHT

TECHNICAL FIELD

The present invention relates to a display device.

BACKGROUND ART

Display devices including cameras or the like provided in frames (non-display areas) surrounding display areas have become common.

CITATION LIST

Patent Literature

PTL 1: Japanese Patent No. 4886462
PTL 2: Japanese Unexamined Patent Application Publication No. 2008-257191

SUMMARY OF INVENTION

Technical Problem

Providing a functional device such as a camera in a frame as described above leads to a problem that the width of the frame increases, which reduces a display area.

Solution to Problem

A display device according to one aspect of the present invention includes a display panel including a first substrate. The display panel has a transparent section (see-through hole section) through which no display light goes out and which is formed to include a partial region of the first substrate. In plan view, the transparent section larger than a pixel is provided on an inner side of an edge of a display area or is provided so as to cut out the display area. The display panel has a back surface on which a functional device configured to perform at least one of light reception or light emission is disposed to overlap the transparent section.

Advantageous Effects of Invention

The display device according to one aspect of the present invention enables the frame to be narrowed and enables the display area (display screen) to be increased.

DESCRIPTION OF EMBODIMENTS

With reference to FIGS. 1 to 15, embodiments of the present invention will be described below. Note that these embodiments are only illustrative.

First Embodiment

Figure 1:
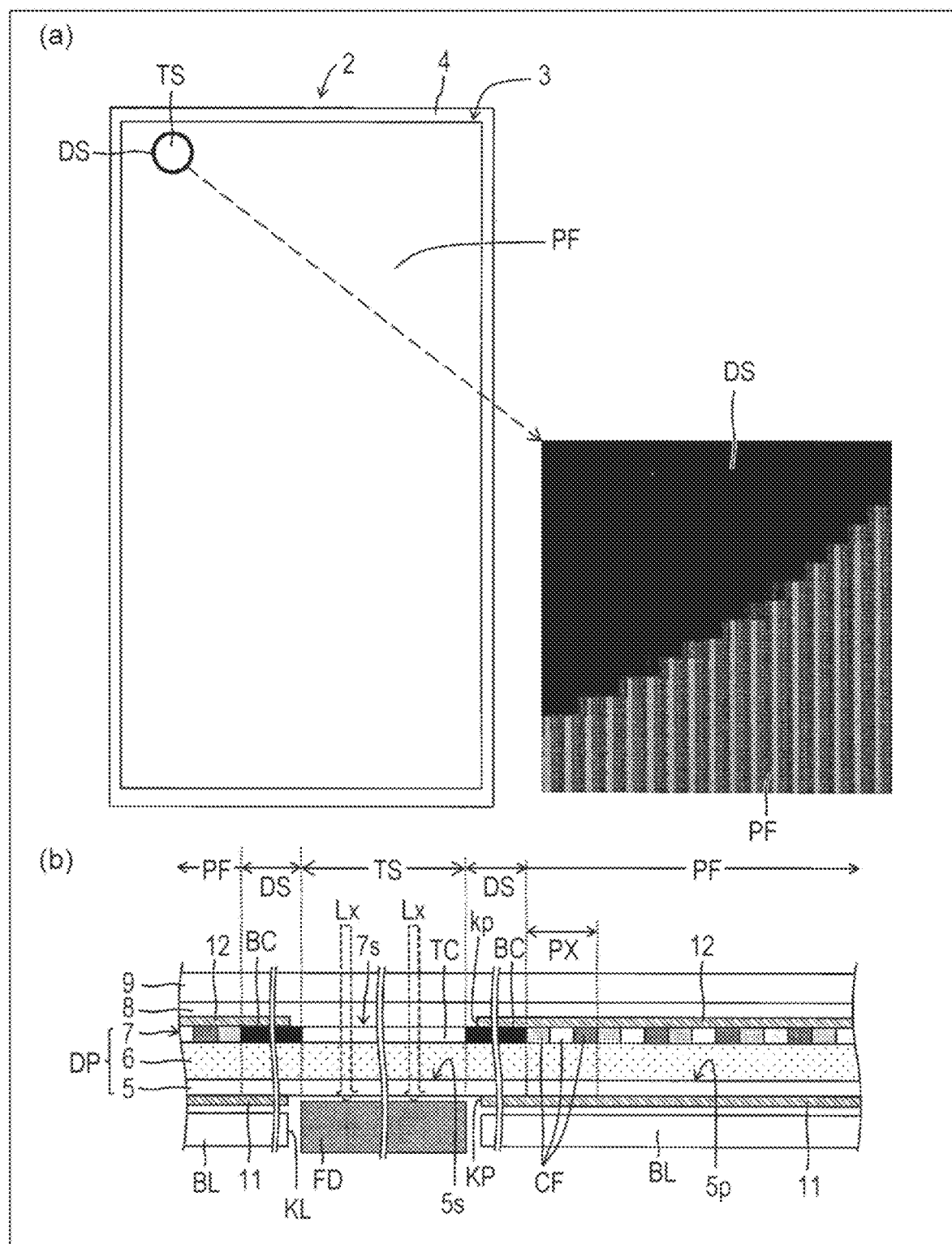
FIG. 1 shows a configuration of a display device according to a first embodiment, wherein (a) is a plan view, and (b) is a sectional view.
Figure 2:
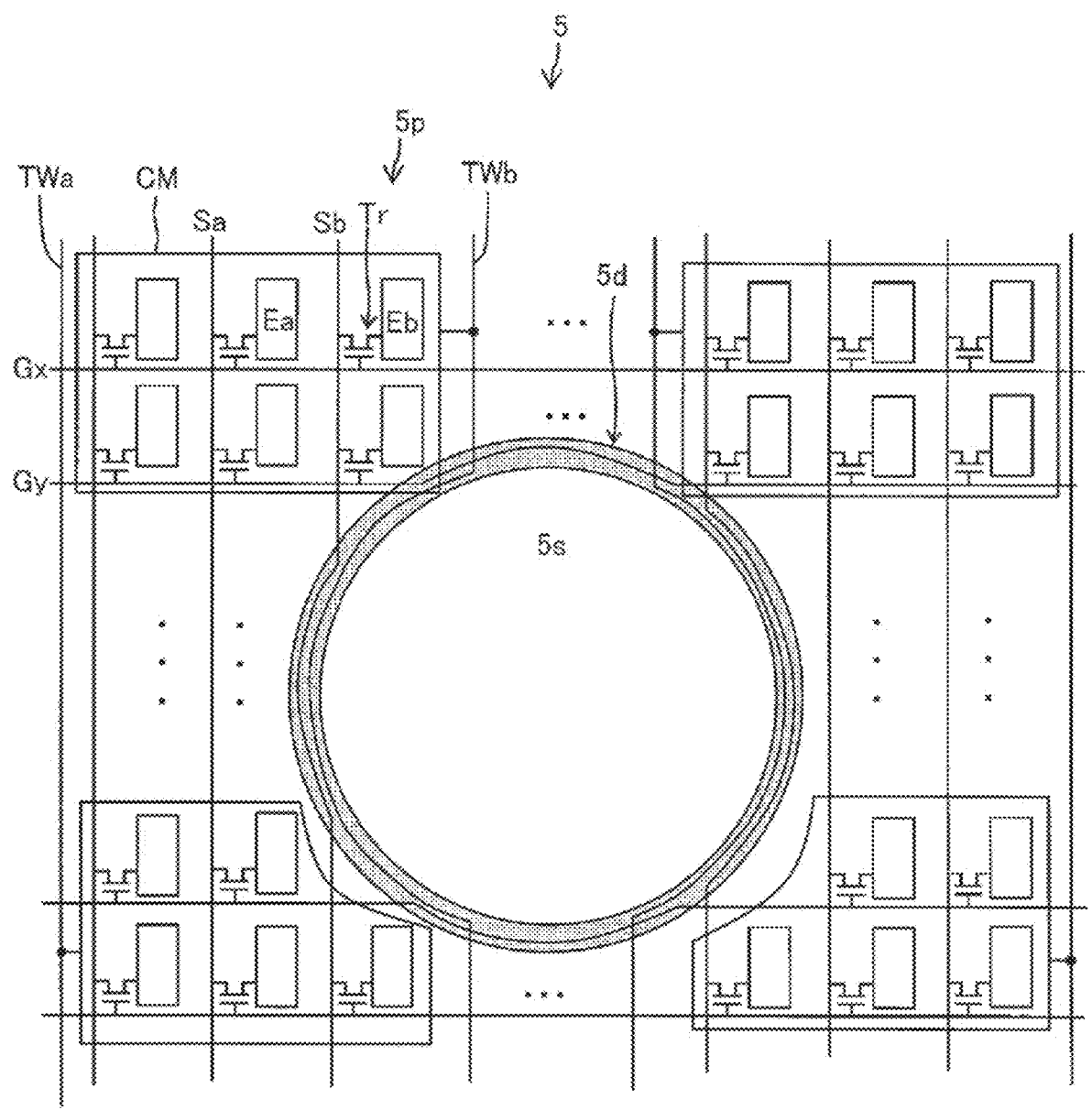
FIG. 2 is a plan view schematically illustrating a configuration of a first substrate.
Figure 3:
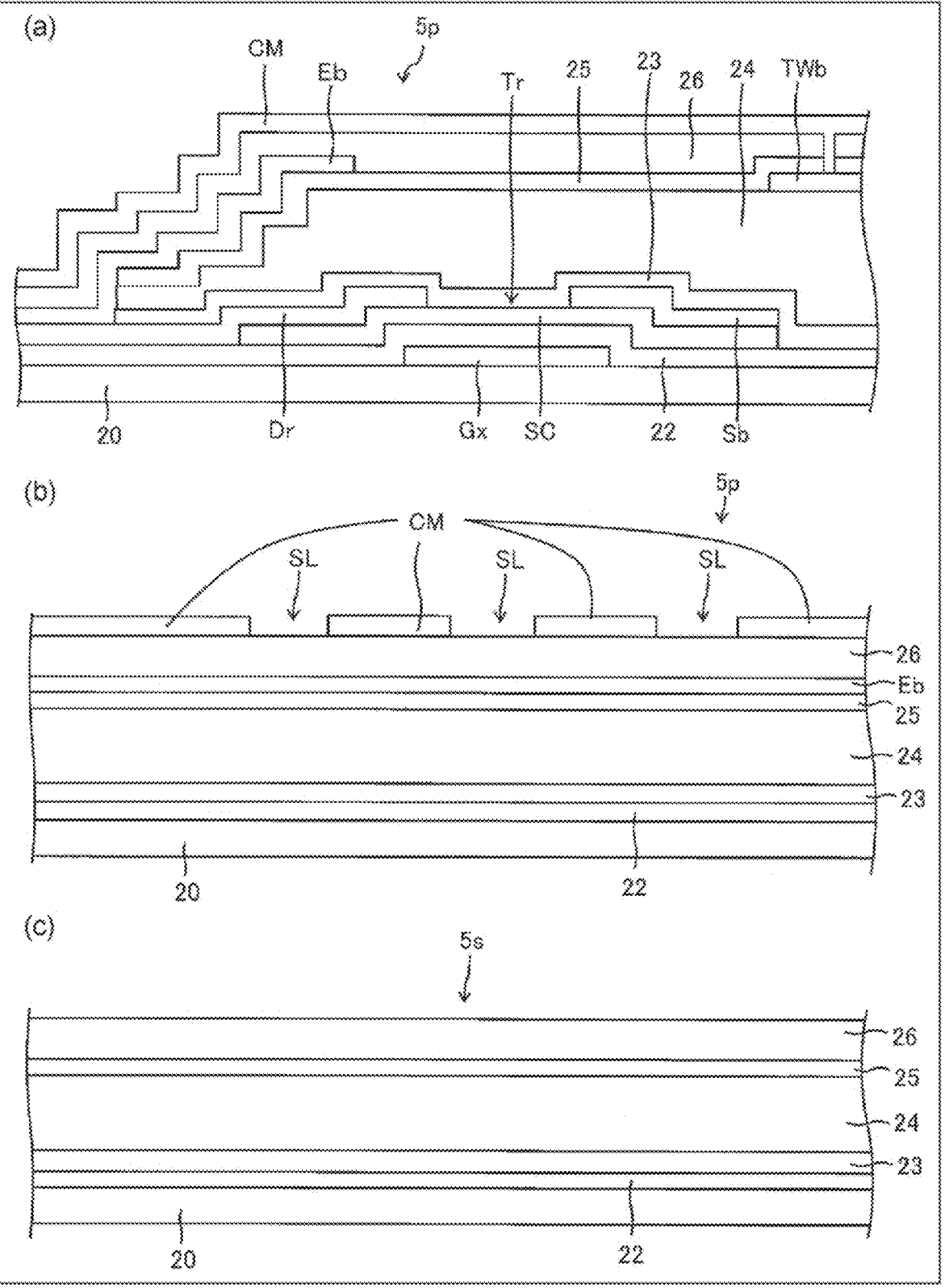
FIG. 3 shows the configuration of the first substrate, wherein (a) and (b) are sectional views each illustrating part corresponding to a pixel formation section, and (c) is a sectional view illustrating part corresponding to a transparent section.

FIG. 1 shows a configuration of a display device according to a first embodiment, wherein (a) is a plan view, and (b) is a sectional view. FIG. 2 is a plan view schematically illustrating a configuration of a first substrate. FIG. 3 shows the configuration of the first substrate, wherein (a) and (b) are sectional views each illustrating part corresponding to a pixel formation section, and (c) is a sectional view illustrating part corresponding to a transparent section.

As shown in FIG. 1, a display device 2 (e.g., smartphone) according to the first embodiment includes a backlight unit BL, a functional device FD (an image sensor including a lens), a display panel DP (a liquid crystal panel), a first polarizer 11 and a second polarizer 12 between which the display panel DP is sandwiched, and a protection plate 9 (cover glass) bonded to the second polarizer 12 with an adhesion layer 8 which is transparent and which is disposed between the protection plate 9 and the second polarizer 12, wherein the display panel DP includes a first substrate 5 (an active matrix substrate), a liquid crystal layer 6, and a second substrate 7 including a primary color filter CF (counter substrate, color filter substrate). In the display device 2, the backlight unit BL, the first polarizer 11, the first substrate 5, the liquid crystal layer 6, the second substrate 7, the second polarizer 12, the adhesion layer 8, and the protection plate 9 are disposed in this order toward the upper direction (in an outgoing direction of display light).

As illustrated in FIGS. 2 and 3, in first substrate 5, a glass substrate 20, scan signal lines Gx and Gy, an inorganic insulating film 22 which is transparent, a semiconductor film SC (e.g., amorphous silicon, low-temperature polysilicon, oxide semiconductor), data signal lines Sa and Sb and a drain electrode Dr, an organic insulating film 24 which is transparent, sensor signal lines TWa and TWb which are transparent, an inorganic insulating film 25 which is transparent, pixel electrodes Ea and Eb which are transparent, an inorganic insulating film 26 which is transparent, and a common electrode CM which is transparent are stacked in this order toward the upper direction (in the outgoing direction of the display light) so as to form transistors Tr in each of which the semiconductor film SC serves as a channel. The pixel electrodes Ea and Eb, the common electrode CM, and the sensor signal lines TWa and TWb may include a transparent metal compound such as ITO or IZO. As illustrated in FIG. 1, the second substrate 7 includes a primary color (red, green, blue) filter CF, a colorless coat (transparent coat) TC, and a black coat BC. The colorless coat TC desirably has a light transmittance of 90% or higher and may be a colorant for white sub-pixels.

As illustrated in FIG. 2 and FIGS. 3(a), (b), in the display panel DP, for example, each pixel electrode Eb is connected via the transistor Tr to the scan signal line Gx and the data signal line Sb, and a plurality of pixel electrodes including the pixel electrodes Eb and the common electrode CM overlap each other with the inorganic insulating film 26 provided therebetween. The common electrode CM is provided with a plurality of slits SL which overlap the pixel electrodes Eb, and a horizontal electric field between the common electrode CM and each pixel electrode Eb controls the orientation of the liquid crystal layer 6.

The common electrode CM is connected to the sensor signal line TWb, and during a display period, a common potential is supplied to the common electrode CM via the sensor signal line TWb. During a sensor period, the common electrode CM functions as a touch sensor electrode, and a sensor signal is transmitted via the sensor signal line TWb.

As illustrated in FIGS. 1 and 2, each pixel electrode Eb, the primary color filter CF, and the liquid crystal layer 6 sandwiched therebetween form one sub-pixel, and a sub-pixel including a red color filter CF, a sub-pixel including a green color filter CF, and a sub-pixel including a blue color filter CF form one pixel PX.

As illustrated in FIG. 1, the display panel DP has: a transparent section TS (e.g., a see-through camera hole) from which no display light goes out; and a light shielding section DS surrounding the transparent section TS. The transparent section TS is larger than the pixel PX in plan view and is formed on an inner side of an edge of the display area 3. The light shielding section DS is surrounded by a pixel formation section PF. The display light is light according to image data and is generated by the pixel PX, and the transparent section TS includes no pixel. The transparent section TS has a planar shape which is, for example, a shape determined by the characteristics of the functional device FD serving as the image sensor. The planar shape is desirably designed in consideration of the angle of light incident on the lens in addition to lens characteristics such as the shape of the lens.

The transparent section TS includes a partial region 5s of the first substrate 5, a partial region 7s of the second substrate 7, and the liquid crystal layer 6 sandwiched therebetween. The first polarizer 11 (facing the backlight unit) has an opening KP formed to overlap the transparent section TS. The second polarizer 12 (viewing surface side) has an opening kp formed to overlap the transparent section TS. The openings KP and kp each have a shape which is, for example, a shape determined by the characteristics of the functional device FD serving as the image sensor. The shapes of the openings are desirably designed in consideration of the angle of light incident on the lens in addition to lens characteristics such as the shape of the lens.

As illustrated in FIGS. 1 to 3, the first substrate 5 has a region 5p corresponding to the pixel formation section PF, and the region 5p includes: a transistor including a semiconductor film; a pixel electrode; a common electrode; a data signal line; a scan signal line; and a sensor signal line, but the partial region 5s (region included in the transparent section TS) of the first substrate 5 includes insulating films 22 to 26 which are transparent (see FIG. 3(c)), and the partial region 5s includes none of: a transistor including a semiconductor film; a pixel electrode; a common electrode; a data signal line; a scan signal line; and a sensor signal line.

For example, the scan signal line Gy, the data signal line Sb, and the sensor signal line TWb bypass, as illustrated in FIG. 2, the partial region 5s to extend through a light shielding region 5d surrounding the partial region 5s. Note that the data signal line (e.g., a titanium aluminum alloy) and the scan signal line (e.g., molybdenum) have a light shielding property.

As illustrated in FIG. 1, the partial region 7s of the second substrate 7 is provided with the colorless coat TC solidly formed and is not provided with the primary color filter. Moreover, the black coat BC for light shielding is formed to surround the colorless coat TC.

The display panel DP has a back surface on which the functional device FD is provided so as to overlap the transparent section TS formed for the display panel DP. Specifically, the backlight unit EL has a hollowed part KL formed to overlap the transparent section TS, and the functional device FD is disposed in the hollowed part KL.

In the display device 2, the functional device FD (the image sensor) receives outside light LX passing through the protection plate 9 which is transparent, the adhesion layer 8 which is transparent, the opening kp in the second polarizer 12, the transparent section TS (the partial region 7s of the second substrate 7, the liquid crystal layer 6, and the partial region 5s of the first substrate 5) of the display panel DP, and the opening KP in the first polarizer 11. Note that no air layer is included in a path from a surface of the protection plate 9 to a back surface of the partial region 5s of the first substrate 5.

According to the first embodiment, the functional device FD (the image sensor) may be disposed an the inner side of the edge of the display area 3 in plan view, and therefore, it is possible to reduce the width of a frame 4 surrounding the display area 3 (display screen), which enables the display area 3 to be increased.

Moreover, in this configuration, the display area has the transparent section TS provided therein and has the back surface provided with the functional device FD. Therefore, the light shielding section surrounding the camera hole is smaller and manufacturing steps become simpler than a configuration in which the camera hole (penetrating through, for example, the active matrix substrate and the color filter substrate) is formed in the display area, and a camera is embedded in the camera hole.

Second Embodiment

Figure 4:
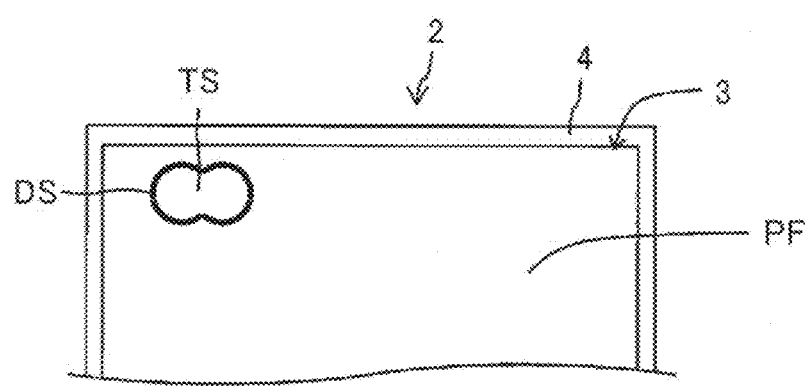
FIG. 4 is a plan view illustrating a configuration of a display device according to a second embodiment.
Figure 4:
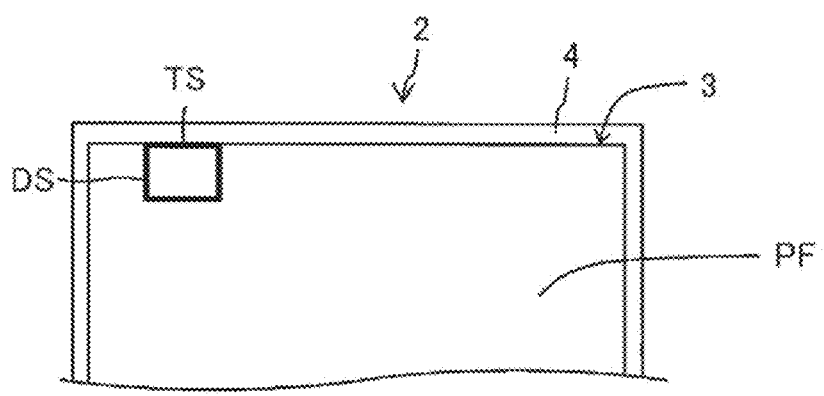
Figure 4:
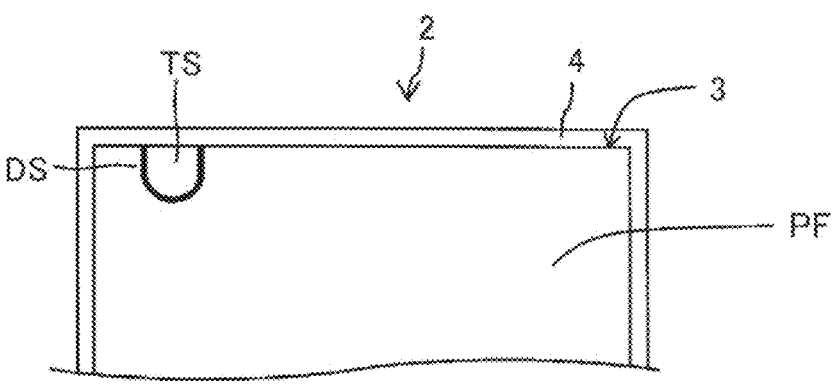

FIG. 4 is a plan view illustrating a configuration of a display device according to a second embodiment. In the first embodiment, the planar shape of the transparent section TS (camera hole) is circular, and the transparent section TS is formed on the inner side of the edge of the display area 3, but this is not to be construed as limiting. As shown in FIG. 4(a), a transparent section TS may have a planar shape corresponding to two circles laterally aligned to partially overlap each other. Alternatively, in plan view, the transparent section TS may be formed to cut out the display area 3.

The cutout shape in this case may be quadrangular as shown in FIG. 4(b) or semi-elliptical as shown in FIG. 4(c).

Third Embodiment

Figure 5:
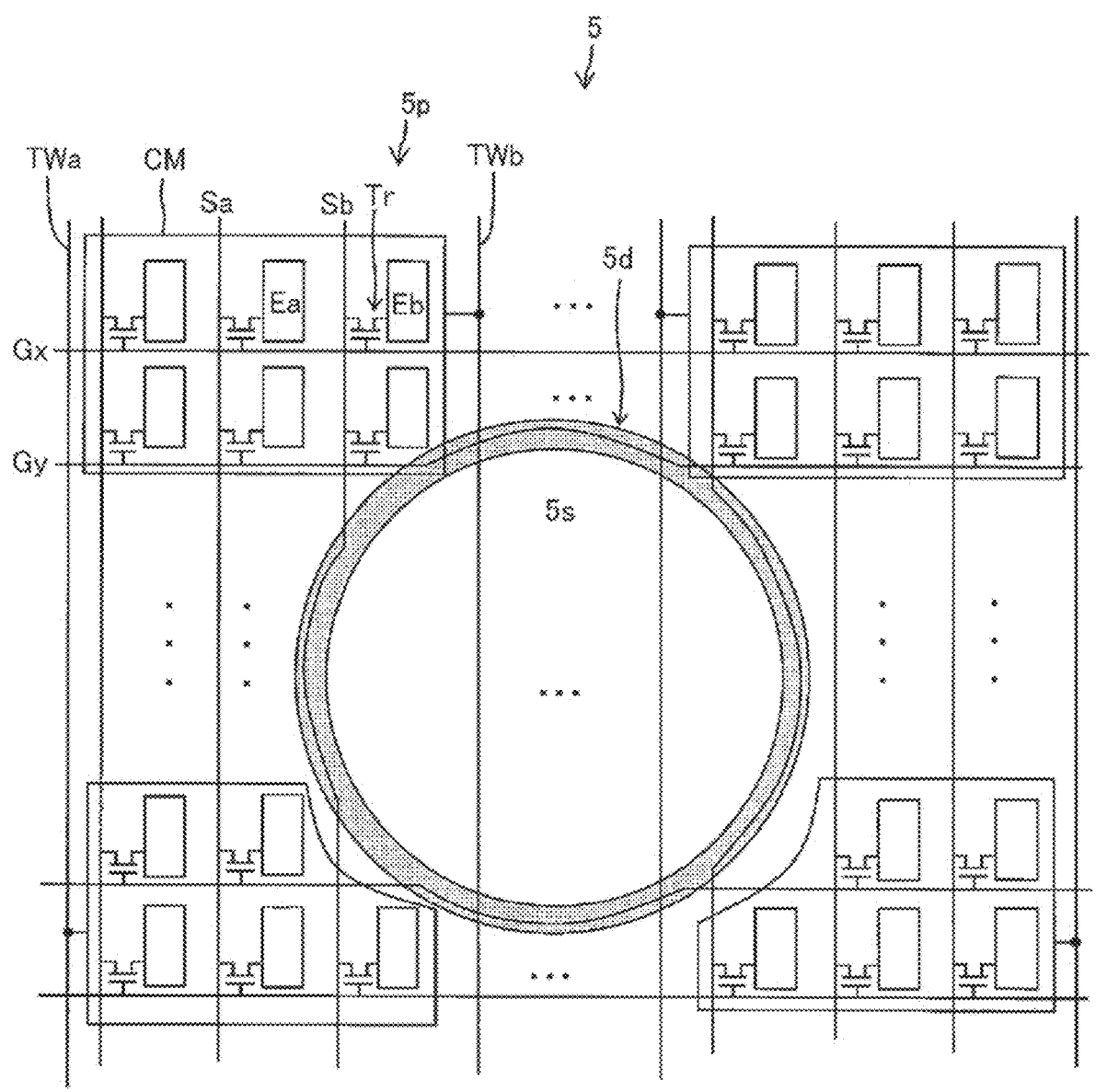
FIG. 5 is a plan view schematically illustrating a configuration of a first substrate of a display device according to a third embodiment.

FIG. 5 is a plan view schematically illustrating a configuration of a first substrate of a display device according to a third embodiment. The sensor signal line TWb of the first embodiment (see FIG. 2) bypasses the partial region 5s (region included in the transparent section TS) of the first substrate so as to extend through the light shielding region 5d, but this is not to be construed as limiting. A sensor signal line TWb made of ITO, IZO, or the like is transparent, and therefore, as Illustrated in FIG. 5, the sensor signal line TWb may extend through a partial region 5s of the first substrate. Note that a common electrode CM made of ITO, IZO, or the like is also transparent, and therefore, the common electrode CM may be formed in the partial region 5s of the first substrate. Thus, is possible to provide a touch sensor also to the transparent section TS.

Fourth Embodiment

Figure 6:
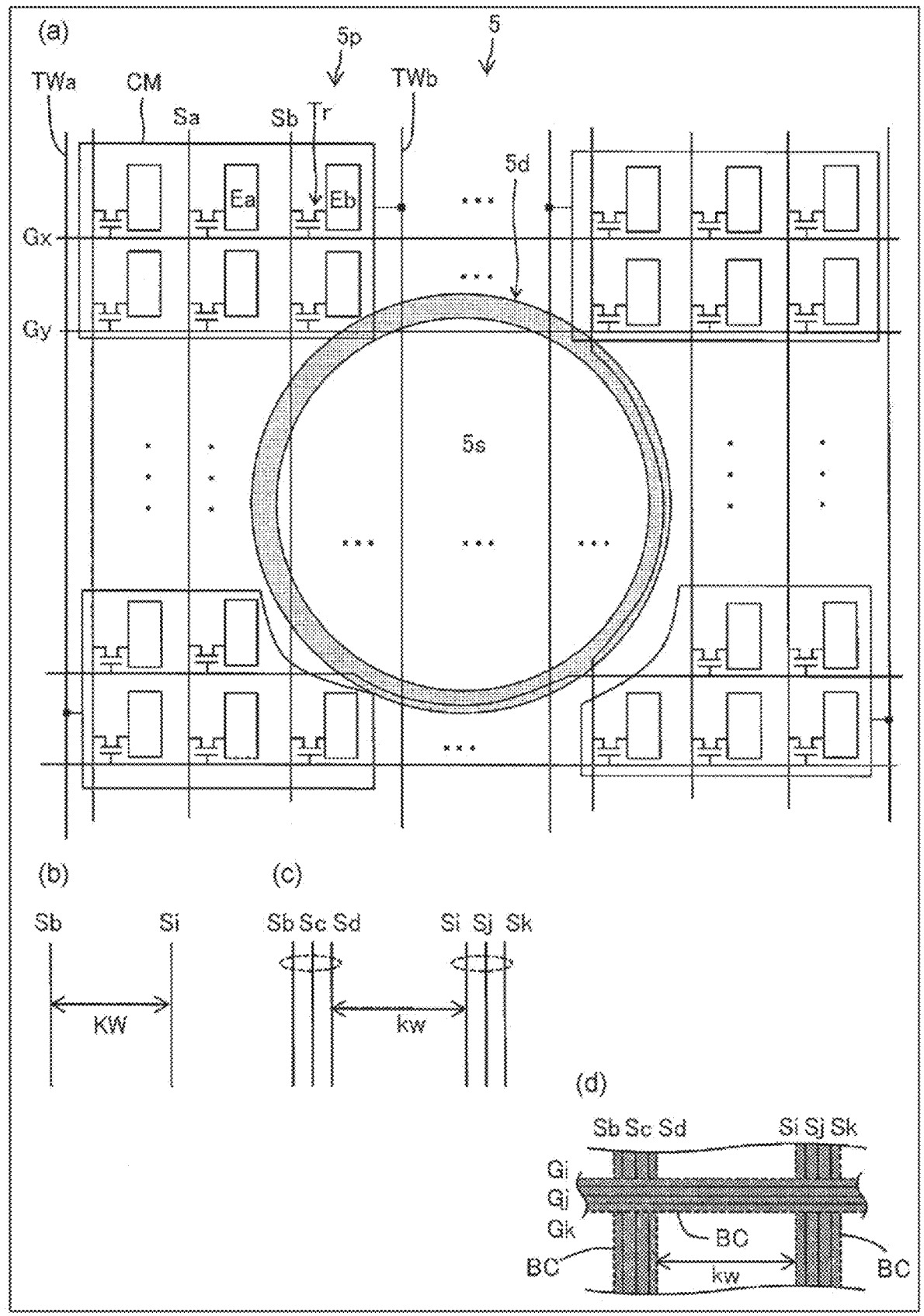
FIG. 6 is a plan view schematically illustrating a configuration of a first substrate of a display device according to a fourth embodiment.

FIG. 6 is a plan view schematically illustrating a configuration of a first substrate of a display device according to a fourth embodiment. The scan signal line Gy and the data signal line Sb of the first embodiment (see FIG. 2) bypasses the partial region 5s (region included in the transparent section TS) of the first substrate so as to extend through the light shielding region 5d, but this is not to be construed as limiting. The scan signal line Gy and the data signal line Sb have a light-shielding property, but when scan signal lines and data signal lines, which otherwise extend through the partial region 5s of the first substrate, are detoured, all the scan signal lines and the data signal lines may not fit in the light shielding region 5d. In such a case, a configuration as illustrated in FIG. 6(a) is possible in which one or more scan signal lines (Gy) and one or more data signal lines (Sb) may extend through a partial region 5s (region included in a transparent section TS) of the first substrate.

In the fourth embodiment, a gap KW between each two adjacent signal lines (e.g., Sb and Si in FIG. 6(b)) serves as a slit, which may cause diffraction and interference phenomena of light. Therefore, the gap KW is desirably designed to have a width which does not cause such phenomena.

Moreover, in order to reduce the width of a light shielding region 5d having an annular shape, it is also effective to arrange a signal line bundle including the plurality of signal lines at intervals in the partial region 5s of the first substrate. Here, the width of the signal line bundle has a size that is not captured by an image sensor. Moreover, the width of a gap kw between each two adjacent signal line bundles (e.g., a bundle of Sb, Sc, and Sd and a bundle of Si, Sj, and Sk in FIG. 6(c)) is desirably designed such that the light transmittance of the transparent section TS does not fall below an allowable range, and such that the gar kw does not function as a slit causing diffraction and interference phenomena of light. Note that simply bundling the signal lines may result in that a fine gap between the signal lines may cause light diffraction. In such a case, as illustrated in FIG. 6(d), the signal line bundle is masked with a black coat BC of a second substrate 7, and a bundle of lines is formed as one black line, thereby suppressing the light diffraction and the like.

Fifth Embodiment

Figure 7:
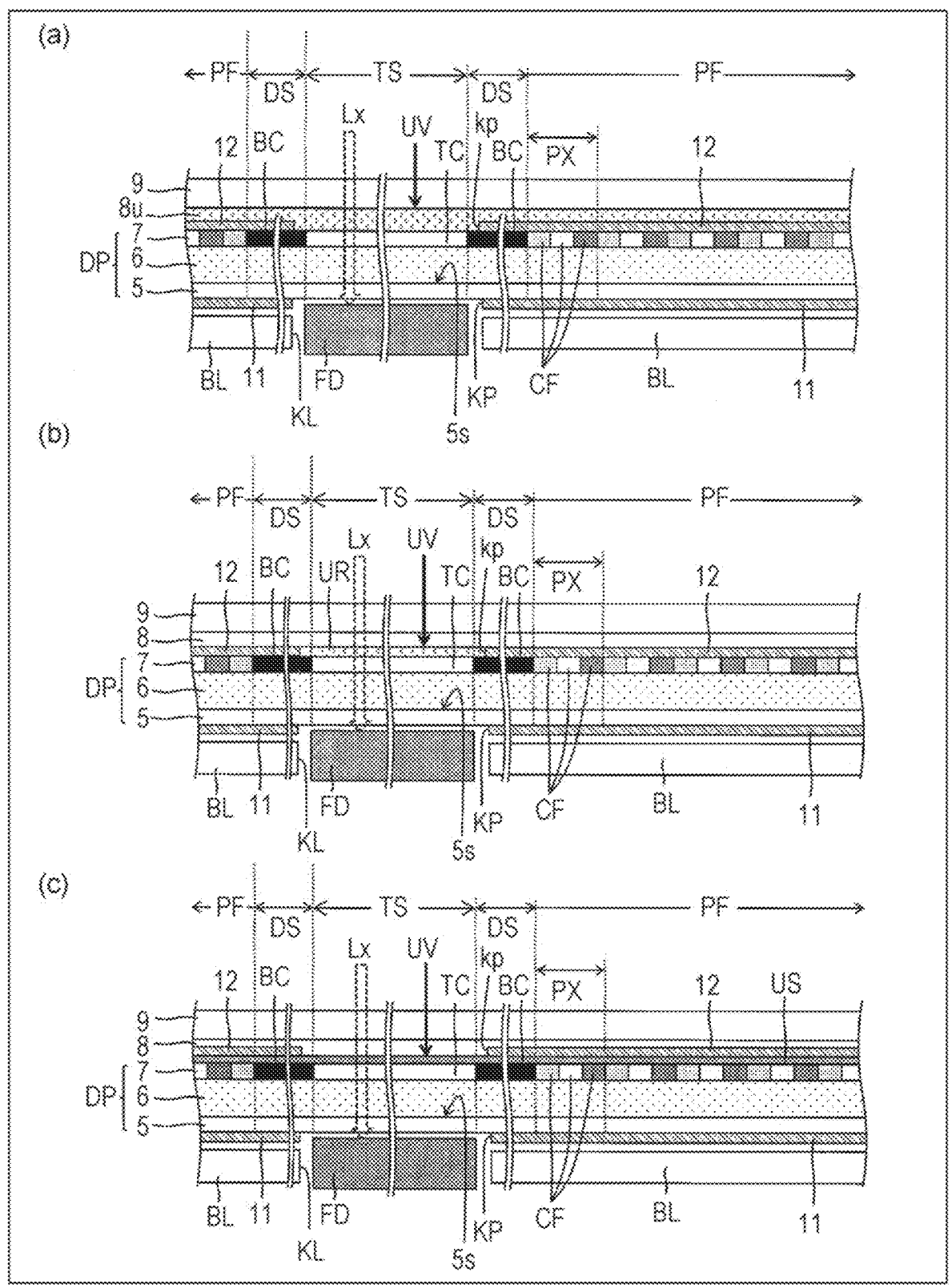
FIG. 7 is a sectional view illustrating a configuration of a display device according to a fifth embodiment.

FIG. 7 is a sectional view illustrating a configuration of a display device according to a fifth embodiment. In FIG. 7(a), for an adhesion layer 8u between a second polarizer 12 and a protection plate 9, a transparent resin which inhibits transmission of ultraviolet radiation is used, and an opening kp in the second polarizer 12 is filled with the adhesion layer 8u. Thus, it becomes difficult for ultraviolet radiation UV to enter a liquid crystal layer 6, and therefore, it is possible to suppress degradation of the liquid crystal layer 6 caused due to the ultraviolet radiation. Alternatively, as illustrated in FIG. 7(b), an adhesion layer 8 is made of a transparent resin which is similar to that in the first embodiment and which is regardless of an UV shielding function, and the opening kp in the second polarizer 12 is filled with a transparent resin UR which inhibits transmission of ultraviolet radiation. This configuration enables options for materials for the adhesion layer 8 to be increased while the ultraviolet radiation UV entering the liquid crystal layer 6 is reduced. Alternatively, as illustrated in FIG. 7(c), an adhesion layer 8 is made of a transparent resin which is similar to that in the first embodiment and which is regardless of an UV shielding function, and a sheet US for inhibiting transmission of ultraviolet radiation is provided on the second substrate 12. This configuration also enables options for materials for the adhesion layer 8 to be increased while the ultraviolet radiation UV entering the liquid crystal layer 6 is reduced.

Sixth Embodiment

Figure 8:
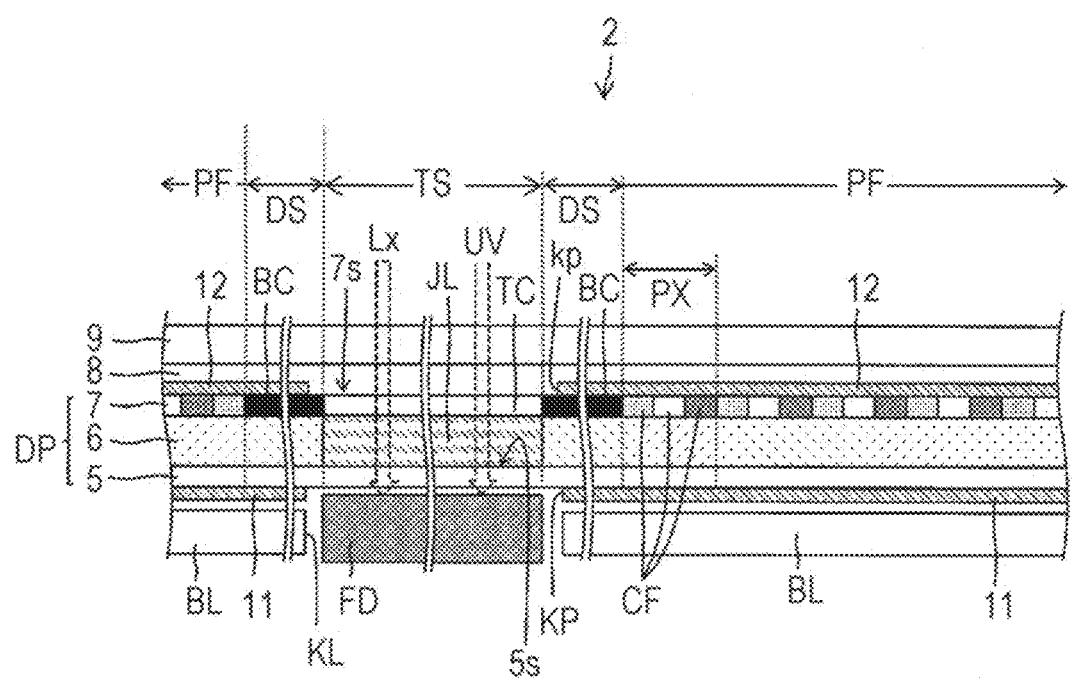
FIG. 8 is a sectional view illustrating a configuration of a display device according to a sixth embodiment.

FIG. 8 is a sectional view illustrating a configuration of a display device according to a sixth embodiment. In the first embodiment (FIG. 1), the liquid crystal layer 6 is between the partial region 5s of the first substrate and the partial region 7s of the second substrate which are included in the transparent section TS, but this is not to be construed as limiting. As illustrated in FIG. 8, a seal layer JL which is transparent may be formed by filling a gap between a partial region 5s of a first substrate and a partial region 7s of a second substrate with sealing material. This enables ultraviolet radiation UV entering a liquid crystal layer 6 to be reduced.

Seventh Embodiment

Figure 9:
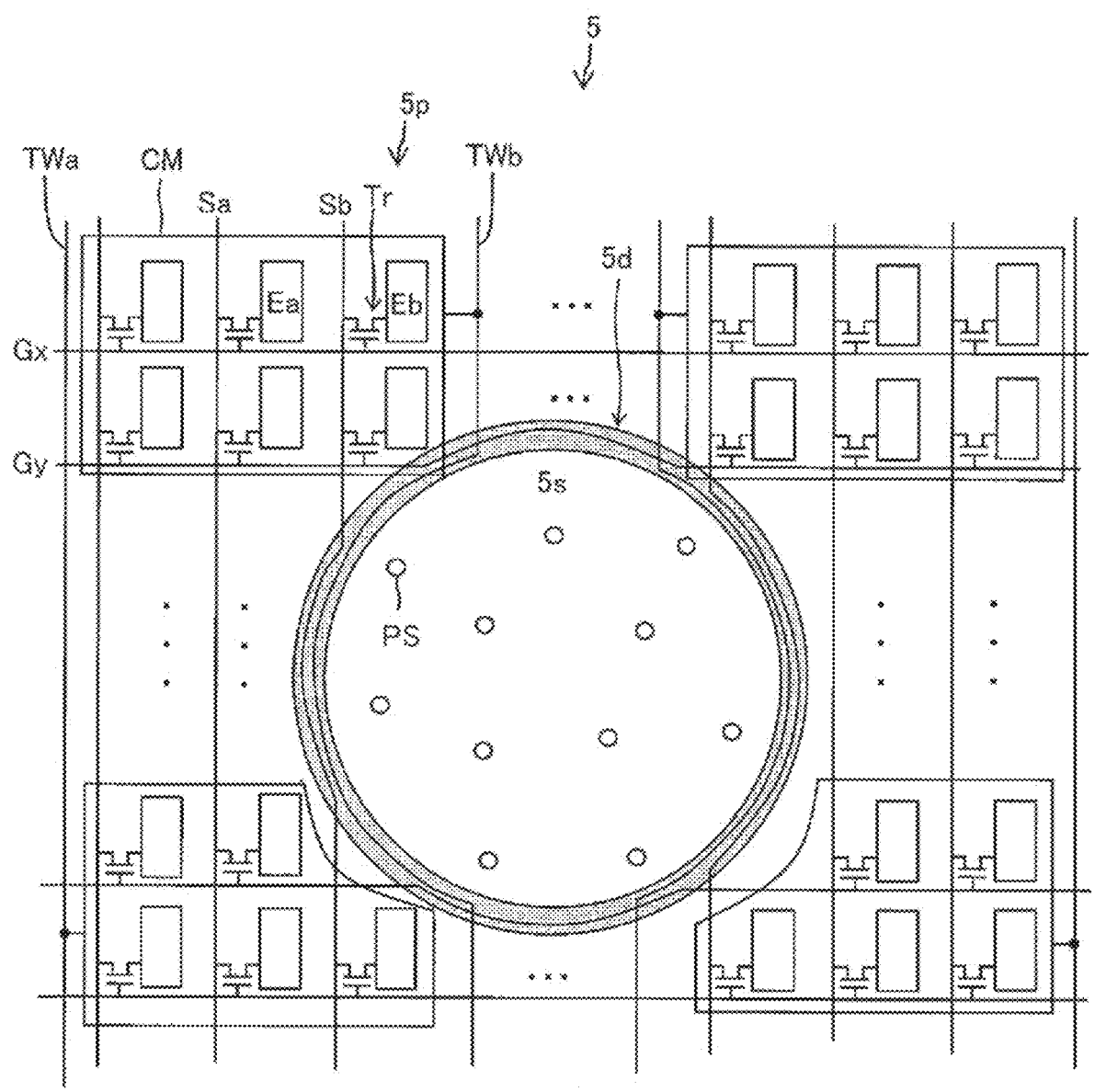
FIG. 9 is a plan view illustrating a configuration of a display device according to a seventh embodiment.

FIG. 9 is a plan view illustrating a configuration of a display device according to a seventh embodiment. In the seventh embodiment, a plurality of photo spacers PS are disposed between a partial region 5s of a first substrate and a partial region 7s of a second substrate which are included in a transparent section TS (in a liquid crystal layer or in a seal layer). This also enables a cell thickness in the transparent section TS to be secured. Also in this case, the number, arrangement, size, and the like of photo spacers are desirably designed in consideration of the light transmittance of the transparent section TS.

Figure 10:
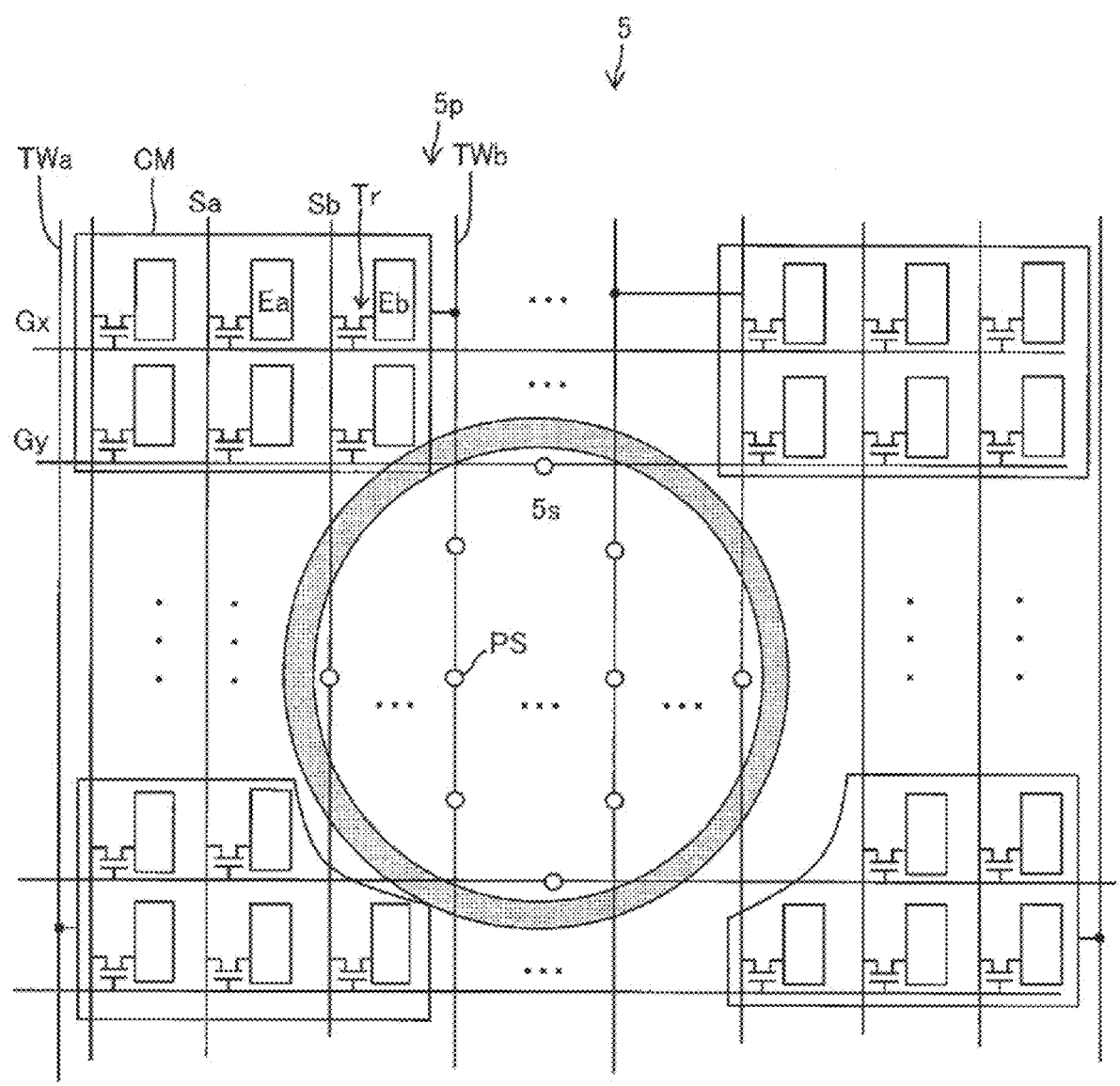
FIG. 10 is a plan view illustrating another configuration of the display device according to the seventh embodiment.

Note that similarly to the fourth embodiment, when a data signal line, a scan signal line, and a sensor signal line extend through the partial region 5s of the first substrate, photo spacers are desirably disposed to overlap the signal lines as illustrated in FIG. 10 to increase the light transmittance.

Eighth Embodiment

Figure 11:
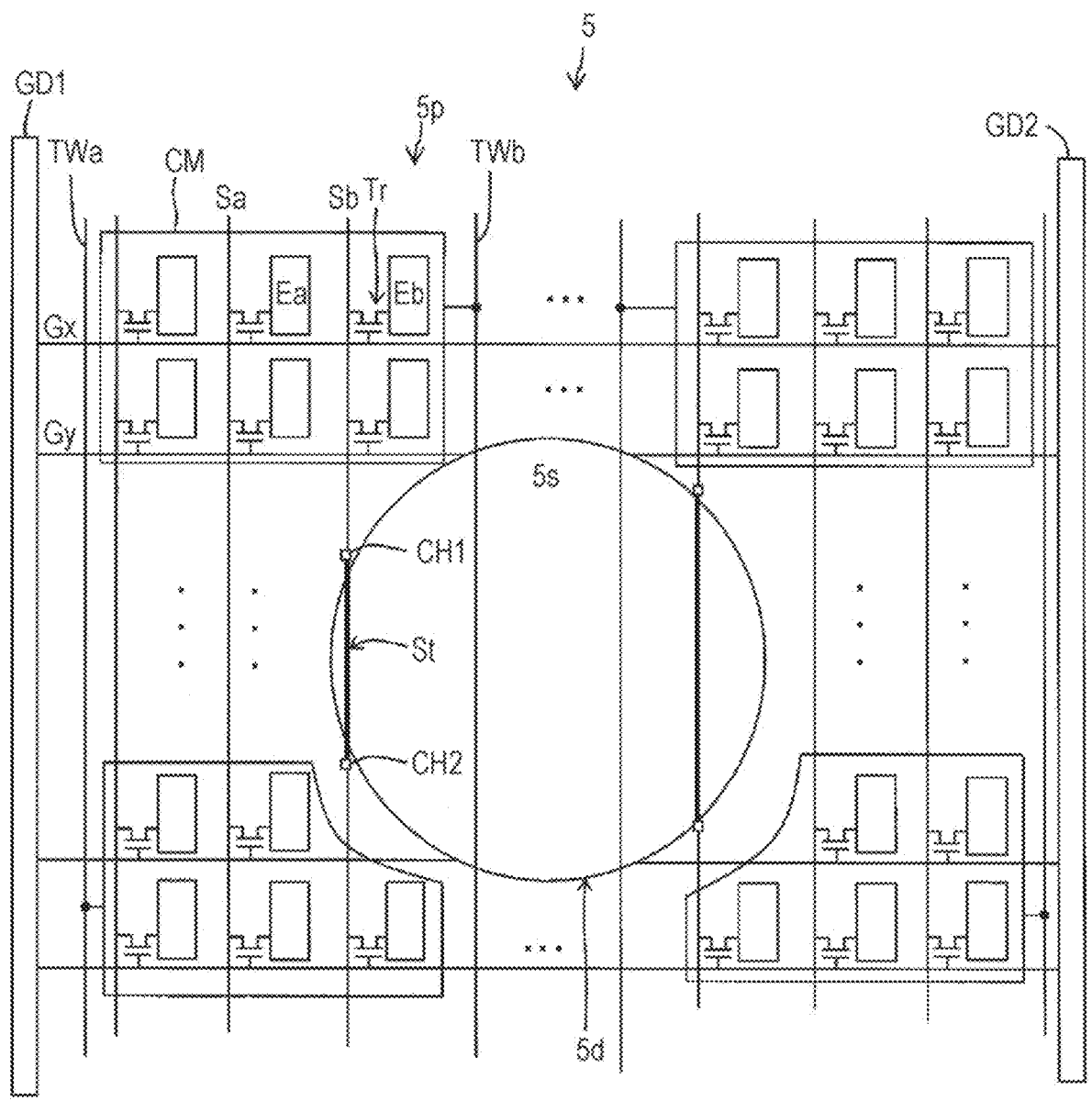
FIG. 11 is a plan view illustrating a. configuration of a display device according to an eighth embodiment.

FIG. 11 is a plan view illustrating a configuration of a display device according to an eighth embodiment. In the eighth embodiment, two gate drivers (GD1, GD2) configured to drive a scan signal line are provided on both sides of a display area, wherein, for example, a scan signal line Gy is not formed in a portion overlapping a partial region 5s of a first substrate (a region included in a transparent section TS), one part obtained by dividing the scan signal lines Gy is driven by the gate driver GD1, and the other part is driven by the gate driver GD2.

Moreover, neither a pixel electrode nor a common electrode is formed in the partial region 5s of the first substrate. Thus, a relay line St which is transparent is formed in a layer of pixel electrodes Ea and Eb (see FIG. 3), and connection of a portion of the data signal line Sb which overlaps the partial region 5s of the first substrate may also be changed to connection to the relay line St via contact holes CH1 and CH2. The relay line St may be made of ITO, IZO, or the like in an identical process for the pixel electrode. However, the relay line St is desirably designed to be thicker than the data signal line Sb in consideration of a resistance value. Note that the relay line St may be formed in a layer of the common electrode CM (see FIG. 3). The eighth embodiment enables the width of a light shielding region 5d to be reduced while the light transmittance of the transparent section TS is maintained.

Ninth Embodiment

Figure 12:
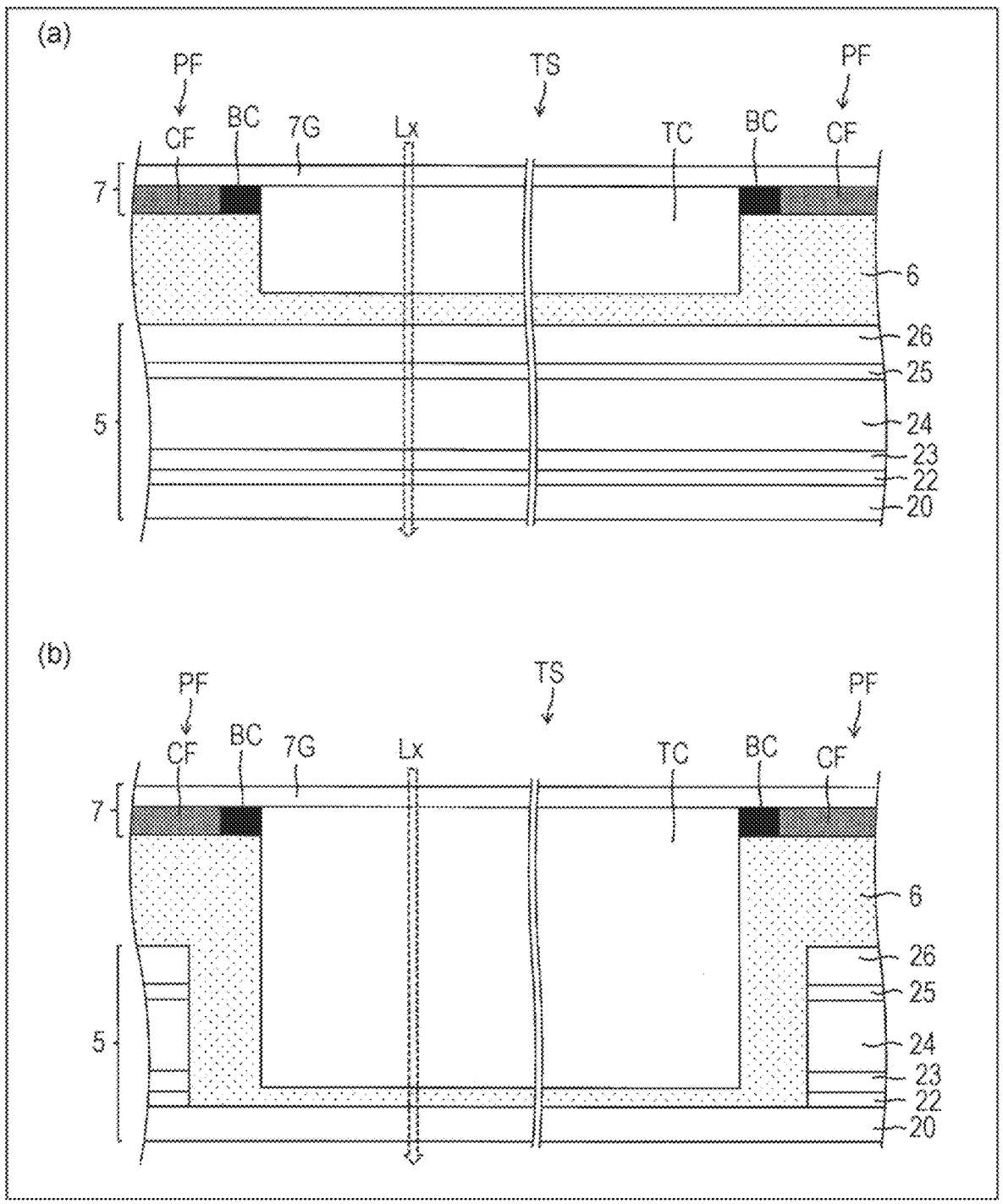
FIG. 12 is a sectional view illustrating a configuration of a display device according to a ninth embodiment.

FIG. 12 is a sectional view illustrating a configuration of a display device according to a ninth embodiment. As illustrated in FIG. 12(a), a second substrate 7 includes a glass substrate 7G, a primary color filter CF, a colorless coat (transparent coat) TC, and a black coat BC, wherein in order to suppress light transmittance from being reduced due to light scattering at a liquid crystal layer 6 between a first substrate 5 and the second substrate 7, the thickness of the colorless coat TC in a transparent section TS is larger than that of the primary color filter CF in the pixel formation section PF such that the cell gap (thickness of liquid crystal layer) in the transparent section TS<the cell gap (thickness of liquid crystal layer, for example, about 3 um) in the pixel formation section PF. This enables the light transmittance in the transparent section TS to be improved.

In FIG. 3(c), the insulating films 22 to 26 are solidly formed in the partial region 5s of the first substrate (region included in the transparent section TS), but this is not to be construed as limiting. When light reflection at an interface between tacked insulating films may reduce the light transmittance and thereby cause a risk of affecting functions such as image capturing, one or more insulating films of the insulating films 22 to 26 may be cleaved (selectively removed) in the partial region 5s so as to avoid stacking of the insulating films in the transparent section TS as much as possible.

FIG. 12(b) shows a configuration in which all the insulating films 22 to 26 in the transparent section TS are cleaved. When the insulating films in the transparent section TS are cleaved, the cell gap in the transparent section TS can be increased. Therefore, as illustrated in FIG. 12(b), it is desirable, for example, that the thickness of the colorless coat TC in the transparent section TS is larger than that of the primary color filter CF in the pixel formation section PF to reduce the cell gap in the transparent section TS so as to increase the light transmittance.

Tenth Embodiment

Figure 13:
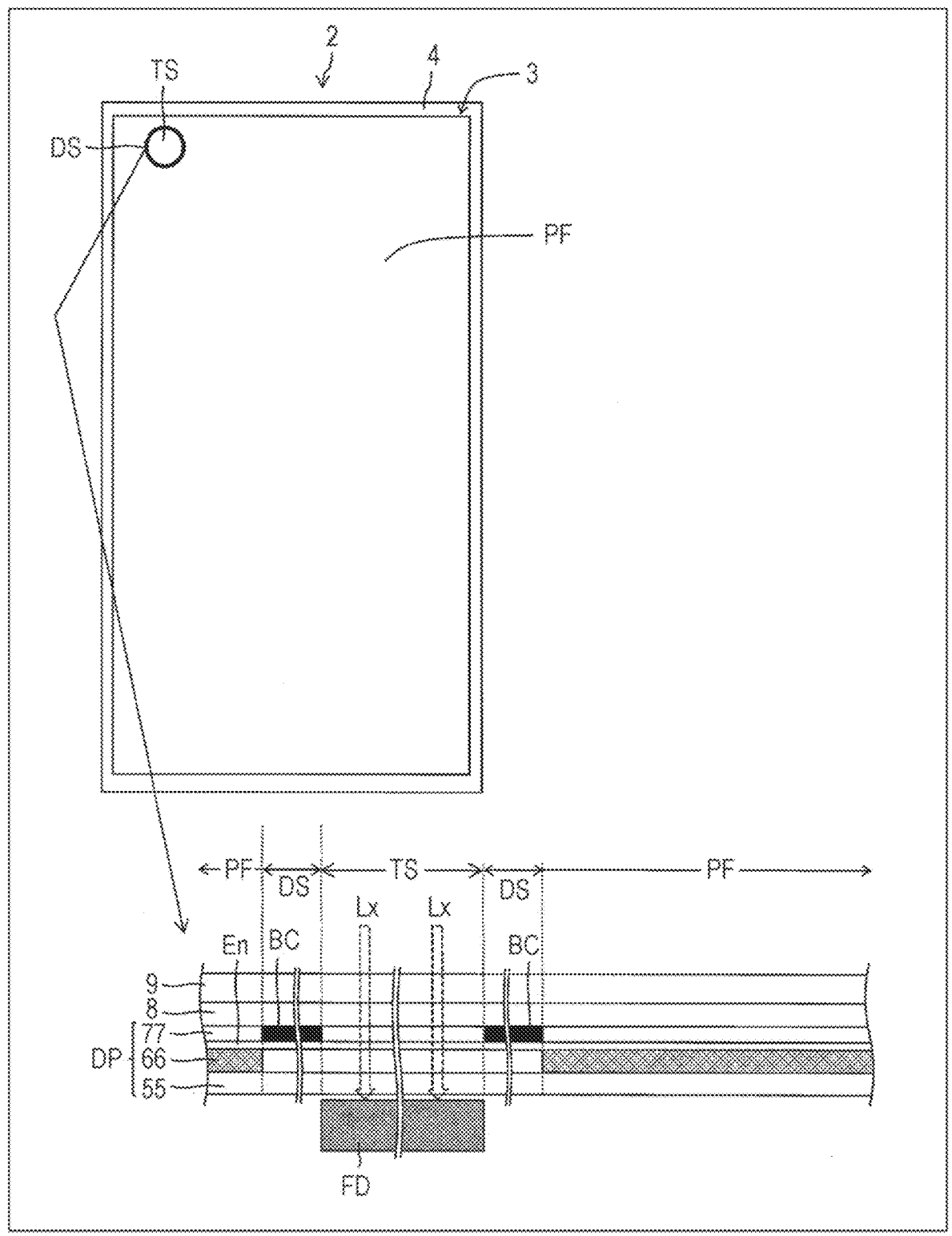
FIG. 13 is a sectional view illustrating a configuration of a display device according to a tenth embodiment.

FIG. 13 is a sectional view illustrating a configuration of a display device according to a tenth embodiment. In the first embodiment (FIG. 1), the display panel DP is a liquid crystal panel, but this is not to be construed as limiting. As illustrated in FIG. 13, a display panel DP may be an electroluminescence (EL) panel. In this case, for example, a first substrate 55 (so-called backplane) includes: substrate which is transparent; a barrier layer which is transparent; and a TFT layer on which a scan signal line, a data signal line, a power supply signal line, a transistor, and a first electrode (anode electrode) which is light reflective are formed. The first substrate 55 has an upper layer on which an EL layer 66, a second electrode (common cathode electrode) En which is transparent, and a sealing layer 77 which is transparent are formed. Note that the sealing layer 77 includes an inorganic insulating film and an organic insulating film, and part of the organic insulating film is a black coat BC.

The display panel DP of the tenth embodiment is of a top-emission type, but a transparent section TS includes none of the scan signal line, the data signal line, the power supply signal line, the transistor, the first electrode, and the EL layer 66 and outputs no display light. Note that as long as light transmittance is secured, the EL layer 66 may be formed in the transparent section TS (which does not include the first electrode and thus emits no light).

Note that a light emitting device including: the first electrode and the second electrode En of the first substrate 55; and the EL layer 66 may be an organic light emitting diode (OLED), an inorganic light emitting diode, or a quantum dot light emitting diode (QLED). Alternatively, the light emitting device may be a micro LED.

As to Each Embodiment

Each of the embodiments describes an FFS mode including a first substrate (active matrix substrate) provided with a common electrode, but this is not to be construed as limiting. A configuration in which the second substrate 7 (color filter substrate) is provided with a common electrode (counter electrode) is, as might be expected, possible.

Each of the embodiments describes an in-cell configuration including a touch sensor provided in a liquid crystal panel, but this is not to be construed as limiting. A configuration in which a touch panel is provided outside a liquid crystal panel is, as might be expected, possible.

In each of the embodiments, the functional device FD is not limited to the image sensor. The functional device FD may be a light emitting device such as an LED light or a light reception element such as an optical sensor. Alternatively, the functional device FD may have both a light reception function and a light emitting function. The image sensor may also be applied to face authentication. Alternatively, the functional device FD may be configured as a fingerprint authentication element (including an optical sensor), and the transparent section TS may be provided with a capacitive touch sensor.

Figure 14:
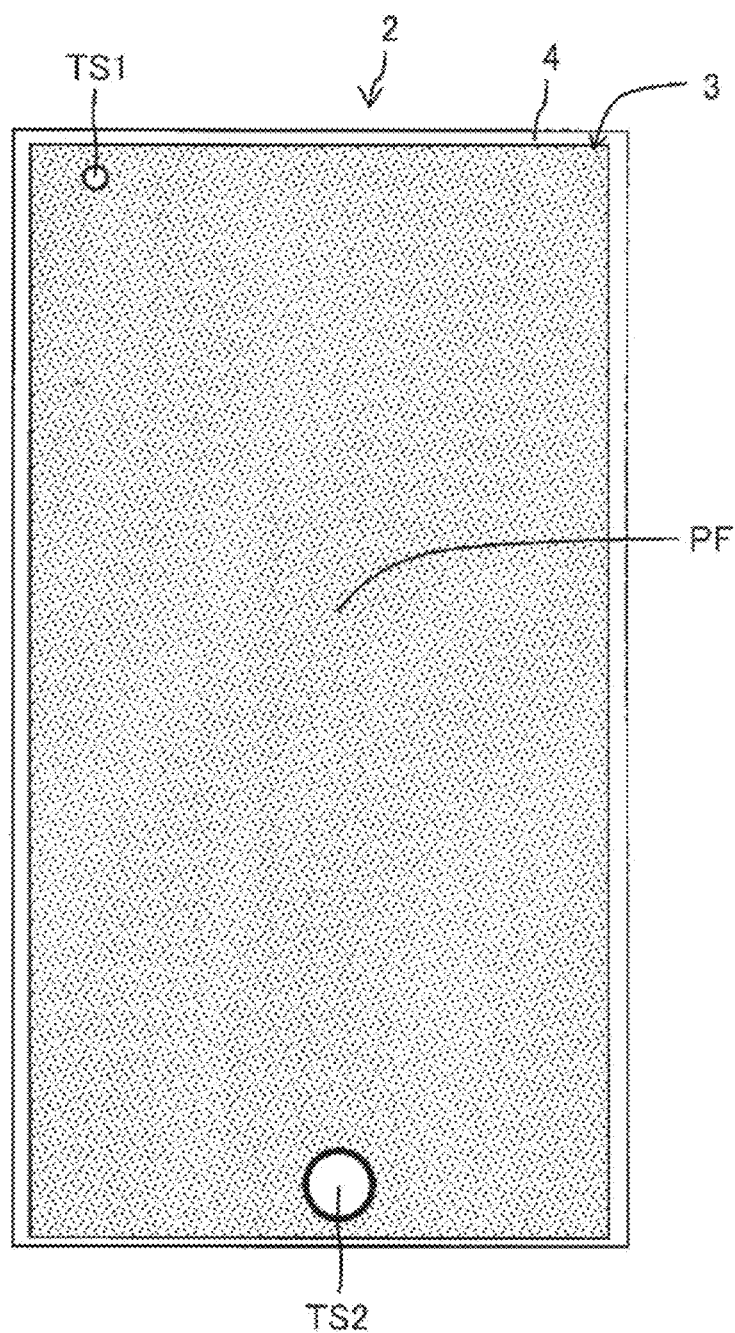
FIG. 14 is a plan view showing a variation of each of the embodiments.
Figure 15:
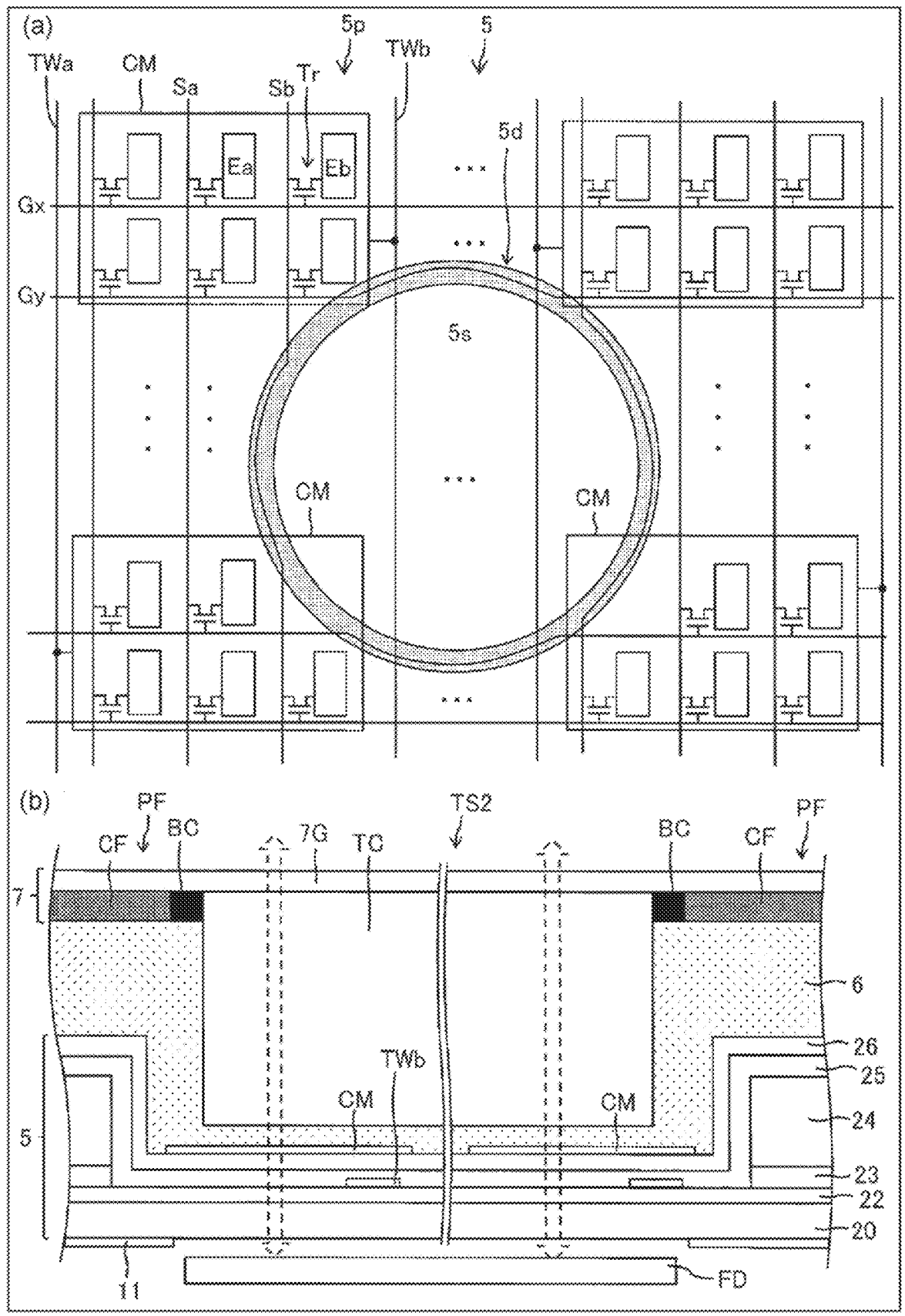
FIG. 15 is a sectional view illustrating a configuration of a display device of FIG. 14.

In each of the embodiments, any shape, any number, and any formation location of the transparent sections TS may be used. In FIG. 14, a plurality of transparent sections TS1 and TS2 are provided. For example, the transparent section TS1 is used to capture images, and the transparent section TS2 is used to authenticate fingerprints. In this case, for example, as illustrated in FIGS. 15(a), (b), the transparent section TS2 is provided with a common electrode CM configured to function as a touch detection sensor electrode, and the transparent section TS2 has a back surface on which functional device FD (including an optical sensor) for fingerprint authentication is disposed. Note that in FIG. 15, in the transparent section TS2, the inorganic insulating film 23 and the organic insulating film 24 are cleaved, and the thickness of the colorless coat TC in the transparent section TS2 is larger than that of the primary color filter CF in the pixel formation section PF, thereby increasing the light transmittance. Note that selective removal of the insulating films 23 and 24 may be performed by, for example, a process of forming a contact hole for connection of the sensor signal line (for terminal connection) to a source layer.

The display device 2 of each of the embodiments may have a communication function and may be a smartphone, a mobile phone, a mobile terminal, or the like. This is, of course, not to be construed as limiting.

SUMMARY

A display device according to some aspects of the present invention includes the following.

First Aspect

A display device includes a display panel including a first substrate, wherein the display panel has a transparent section through which no display light goes out and which is formed to include a partial region of the first substrate, in plan view, the transparent section larger than a pixel is provided on an inner side of as edge of a display area or is provided so as to cut out the display area, and the display panel has a back surface on which a functional device configured to perform at least one of light reception or light emission is disposed to overlap the transparent section.

Second Aspect

In the display device described in, for example, the first aspect, the display panel includes: the first substrate including a scan signal line, a data signal line, a transistor, and a pixel electrode; a second substrate including a primary color filter; and a liquid crystal layer sandwiched between the first substrate and the second substrate, and the transparent section includes a partial region of the second substrate.

Third Aspect

The display device described in, for example, the second aspect further includes a first polarizer and a second polarizer between which the display panel is sandwiched, wherein each of the first polarizer and the second polarizer has an opening formed to overlap the transparent section.

Fourth Aspect

The display device described in, for example, the second or third aspect further includes a backlight unit having a hollowed part formed to overlap the transparent section, wherein the functional device is disposed in the hollowed part.

Fifth Aspect

The display device described in, for example, any one of the second to fourth aspects further includes a light shielding section provided to surround the transparent section.

Sixth Aspect

In the display device described in, for example, any one of the second to fifth aspects, the transparent section includes no primary color filter.

Seventh Aspect

In the display device described in, for example, any one of the second to sixth aspects, in the transparent section, the liquid crystal layer is sandwiched between the partial region of the first substrate and the partial region of the second substrate.

Eighth Aspect

In the display device described in, for example, any one of the second to seventh aspects, the transparent section includes a seal layer which is transparent and which is sandwiched between the partial region of the first substrate and the partial region of the second substrate.

Ninth Aspect

In the display device described in, for example, the third aspect, the transparent section includes a transparent resin which is provided on a surface side of the partial region of the second substrate and which inhibits transmission of ultraviolet radiation.

Tenth Aspect

In the display device described in, for example, the ninth aspect, the transparent resin is disposed in the opening formed in the second polarizer.

Eleventh Aspect

The display device described in, for example, the ninth or tenth aspect further includes a protection plate bonded to the display panel with the transparent resin.

Twelfth Aspect

The display device described in, for example, any one of the second to eleventh aspects, wherein the partial region of the first substrate includes no transistor.

Thirteenth Aspect

The display device described in, for example, any one of the second to twelfth aspects, wherein the partial region of the first substrate includes no pixel electrode.

Fourteenth Aspect

The display device described in, for example, any one of the second to thirteenth aspects, wherein the first substrate includes a common electrode, and the partial region of the first substrate includes no common electrode.

Fifteenth Aspect

The display device described in, for example, any one of the second to fourteenth aspects further includes a data signal line bypassing the partial region of the first substrate.

Sixteenth Aspect

The display device described in, for example, any one of the second to fifteenth aspects further includes a scan signal line bypassing the partial region of the first substrate.

Seventeenth Aspect

The display device described in, for example, any one of the second to sixteenth aspects further includes a transparent signal line extending through the partial region of the first substrate.

Eighteenth Aspect

The display device described in, for example, any one of the second to seventeenth aspect further includes at least one of a data signal line extending through the partial region of the first substrate or a scan signal line extending through the partial region of the first substrate.

Nineteenth Aspect

The display device described in, for example, the eighteenth aspect, wherein the transparent section includes a photo spacer overlapping at least one of the data signal line extending through the partial region of the first substrate or the scan signal line extending through the partial region of the first substrate.

Twentieth Aspect

The display device described in, for example, any one of the first to nineteenth aspects, wherein the functional device is an image sensor.

Twenty-First Aspect

The display device described in, for example, the third aspect further includes a protection plate which is transparent and which is disposed on an uppermost surface of the display device, wherein no air layer is provided in a path from the functional device through the opening in the first polarizer, the transparent section, and the opening in the second polarizer to the protection plate.

Twenty-Second Aspect

In the display device described in, for example, the second aspect, the display panel includes a pixel formation section including a pixel, and the liquid crystal layer has a thickness smaller in the transparent section than in the pixel formation section.

Twenty-Third Aspect

The display device described in, for example, the second aspect, wherein the first substrate includes a plurality of insulating films, and in the partial region of the first substrate, at least one of the plurality of insulating films is cleaved.

Twenty-Fourth Aspect

In the display device described in, for example, the twenty-second or twenty-third aspect, the partial region of the second substrate includes a colorless coat having a thickness larger than a thickness of the primary color filter.

Twenty-Fifth Aspect

The display device described in, for example, the first aspect, wherein the display panel includes: the first substrate including a scan signal line, a data signal line, a transistor, and a first electrode; an electroluminescence layer; a second electrode; and a sealing layer.

The present invention is not limited to the embodiments described above. Various modifications may be made within the scope of the claims. The present invention also encompasses, in its technical scope, any embodiment derived by combining technical means disclosed in differing embodiments. Further, it is possible to form a new technical feature by combining the technical means disclosed in the respective embodiments.

REFERENCE SIGNS LIST

2 DISPLAY DEVICE
3 DISPLAY AREA
4 FRAME
5, 55 FIRST SUBSTRATE
6 LIQUID CRYSTAL LAYER
7 SECOND SUBSTRATE
66 EL LAYER
77 SEALING LAYER
DP DISPLAY PANEL
CM COMMON ELECTRODE
Ea, Eb PIXEL ELECTRODE
Gx, Gy SCAN SIGNAL LINE
Sa, Sb DATA SIGNAL LINE
Tr TRANSISTOR
PX PIXEL
TS TRANSPARENT SECTION
PF PIXEL FORMATION SECTION
DS LIGHT SHIELDING SECTION
FD FUNCTIONAL DEVICE
BL BACKLIGHT UNIT
CF PRIMARY COLOR FILTER
TC TRANSPARENT COAT
BC BLACK COAT

The invention claimed is:

1. A display device comprising:
a display panel including a first substrate, a second substrate, and a liquid crystal layer sandwiched between the first substrate and the second substrate;
a first polarizer and a second polarizer between which the display panel is sandwiched; and
a backlight unit provided at a back surface of the display panel, wherein
the backlight unit has a hollowed part,
the display panel has a portion which overlaps the hollowed part in plan view and at which the first polarizer and the second polarizer have openings, the portion serving as a transparent section,
the display panel at the transparent section emits no display light,
in plan view, the transparent section is larger than a pixel and is provided on an inner side of an edge of a display area or is provided so as to cut out the display area, and
the display panel has a back surface on which a functional device configured to perform at least one of light reception or light emission is disposed to overlap the transparent section.

2. The display device according to claim 1, wherein
the first substrate includes a scan signal line, a data signal line, a transistor, and a pixel electrode;
the second substrate includes a primary color filter; and
the second substrate has a partial region at the transparent section which partial region is provided with a colorless coat but is not provided with the primary color filter.

3. The display device according to claim 1, wherein
the openings of the first polarizer and the second polarizer are hollowed parts formed in the first polarizer and the second polarizer, respectively, and
the transparent section is a part of the display panel exposed via the hollowed parts formed in the first polarizer and the second polarizer.

4. The display device according to claim 1, wherein
the functional device is disposed in the hollowed part.

5. The display device according to claim 1, further comprising:
a light shielding section provided to surround the transparent section.

6. The display device according to claim 1, wherein
the transparent section includes a partial region of the first substrate and a partial region of the second substrate, and
in the transparent section, the liquid crystal layer is sandwiched between the partial region of the first substrate and the partial region of the second substrate.

7. The display device according to claim 1, wherein
the transparent section includes a partial region of the first substrate and a partial region of the second substrate, and
the transparent section includes a seal layer which is transparent and which is sandwiched between the partial region of the first substrate and the partial region of the second substrate.

8. The display device according to claim 1, wherein
the transparent section includes a partial region of the second substrate, and
the transparent section includes a transparent resin which is provided on a surface side of the partial region of the second substrate and which inhibits transmission of ultraviolet radiation.

9. The display device according to claim 8, wherein
the transparent resin is disposed in the opening formed in the second polarizer.

10. The display device according to claim 8, further comprising:
a protection plate bonded to the display panel with the transparent resin.

11. The display device according to claim 1, wherein
the transparent section includes a partial region of the first substrate, and
the partial region of the first substrate includes no transistor.

12. The display device according to claim 1, wherein
the transparent section includes a partial region of the first substrate, and
the partial region of the first substrate includes no pixel electrode.

13. The display device according to claim 1, wherein
the transparent section includes a partial region of the first substrate, and
the first substrate includes a common electrode, and the partial region of the first substrate includes no common electrode.

14. The display device according to claim 1, wherein
the transparent section includes a partial region of the first substrate, and
the display device further comprises:
a data signal line bypassing the partial region of the first substrate.

15. The display device according to claim 1, wherein
the transparent section includes a partial region of the first substrate, and
the display device further comprises:
a scan signal line bypassing the partial region of the first substrate.

16. The display device according to claim 1, wherein
the transparent section includes a partial region of the first substrate, and
the display device further comprises:
a transparent signal line extending through the partial region of the first substrate.

17. The display device according to claim 1, wherein
the transparent section includes a partial region of the first substrate, and
the display device further comprises:
at least one of a data signal line extending through the partial region of the first substrate or a scan signal line extending through the partial region of the first substrate.

18. The display device according to claim 17, wherein
the transparent section includes a partial region of the first substrate, and
the transparent section includes a photo spacer overlapping at least one of the data signal line extending through the partial region of the first substrate or the scan signal line extending through the partial region of the first substrate.

19. The display device according to claim 1, wherein
the functional device is an image sensor.

20. The display device according to claim 1, further comprising:
a protection plate which is transparent and which is disposed on an uppermost surface of the display device, wherein
no air layer is provided in a path from the functional device through the opening in the first polarizer, the transparent section, and the opening in the second polarizer to the protection plate.

21. The display device according to claim 1, wherein
the display panel includes a pixel formation section including a pixel, and
the liquid crystal layer has a thickness smaller in the transparent section than in the pixel formation section.

22. The display device according to claim 21, wherein
the transparent section includes a partial region of the second substrate,
the partial region of the second substrate includes a colorless coat having a thickness larger than a thickness of the primary color filter.

23. The display device according to claim 1, wherein
the transparent section includes a partial region of the first substrate,
the first substrate includes a plurality of insulating films, and
in the partial region of the first substrate, at least one of the plurality of insulating films is cleaved.

* * * * *